(12) United States Patent
Takeya et al.

(10) Patent No.: US 10,699,968 B2
(45) Date of Patent: Jun. 30, 2020

(54) SEMICONDUCTOR MANUFACTURING APPARATUS

(75) Inventors: Yukari Takeya, Kumamoto (JP); Hayato Iwamoto, Kumamoto (JP); Yoshiya Hagimoto, Kumamoto (JP); Eizo Motooka, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 316 days.

(21) Appl. No.: 13/408,293

(22) Filed: Feb. 29, 2012

(65) Prior Publication Data

US 2012/0231562 A1 Sep. 13, 2012

(30) Foreign Application Priority Data

Mar. 11, 2011 (JP) ................................. 2011-054702

(51) Int. Cl.
| | | |
|---|---|---|
| H01L 21/66 | (2006.01) | |
| B05C 11/00 | (2006.01) | |
| B24B 57/02 | (2006.01) | |
| B24B 37/26 | (2012.01) | |
| B24B 37/005 | (2012.01) | |
| B24B 37/32 | (2012.01) | |
| B24B 53/017 | (2012.01) | |

(52) U.S. Cl.
CPC .............. *H01L 22/12* (2013.01); *H01L 22/20* (2013.01); *B05C 11/00* (2013.01); *B24B 37/005* (2013.01); *B24B 37/26* (2013.01); *B24B 37/32* (2013.01); *B24B 53/017* (2013.01); *B24B 57/02* (2013.01)

(58) Field of Classification Search
USPC .......................... 156/345.15, 345.16, 345.25
See application file for complete search history.

(56) References Cited

U.S. PATENT DOCUMENTS

| 5,695,601 A * | 12/1997 | Kodera ................. B24B 37/005 |
| | | 156/345.13 |
| 2002/0059943 A1* | 5/2002 | Inagaki ..................... B08B 3/08 |
| | | 134/18 |
| 2003/0000644 A1* | 1/2003 | Subramanian et al. ..................... |
| | | 156/345.24 |

(Continued)

FOREIGN PATENT DOCUMENTS

| JP | 11-186204 | 7/1999 |
| JP | 11-251288 | 9/1999 |
| JP | 2004-319574 | 11/2004 |

OTHER PUBLICATIONS

"Circuitry" as defined in Merriam Webster Dictionary forund on www.merriam-webster.com/dictionary/circuitry. First published in print 1946.*

*Primary Examiner* — Sylvia MacArthur
(74) *Attorney, Agent, or Firm* — Chip Law Group

(57) ABSTRACT

A semiconductor manufacturing apparatus includes: a treatment chamber treating a treated film of a wafer using a desired chemical fluid; a film thickness measurement unit measuring an initial film thickness of the treated film before treatment and a final film thickness of the treated film after treatment; and a main body controlling unit calculating a treatment speed of the chemical fluid from the initial film thickness, the final film thickness, and a chemical fluid treatment time taken from the initial film thickness to the final film thickness to calculate a chemical fluid treatment time for a wafer to be treated next from the calculated treatment speed.

10 Claims, 6 Drawing Sheets

(56) References Cited

U.S. PATENT DOCUMENTS

| | | | |
|---|---|---|---|
| 2003/0017256 A1* | 1/2003 | Shimane | B05C 11/02 427/9 |
| 2003/0077904 A1* | 4/2003 | Kakita | B24B 37/013 438/689 |
| 2003/0121889 A1* | 7/2003 | Takahashi | G01B 11/0675 216/84 |
| 2005/0197046 A1* | 9/2005 | Aoyagi et al. | 451/5 |
| 2006/0166503 A1* | 7/2006 | Sasaki et al. | 438/692 |
| 2007/0102116 A1* | 5/2007 | Shanmugasundram et al. | 156/345.13 |
| 2007/0233306 A1* | 10/2007 | Takada | B24B 37/013 451/66 |
| 2012/0003759 A1* | 1/2012 | Hu | B24B 37/013 438/8 |
| 2012/0052600 A1* | 3/2012 | Kamimura | G05B 19/41875 438/8 |
| 2012/0231562 A1* | 9/2012 | Takeya et al. | 438/14 |
| 2013/0011630 A1* | 1/2013 | Sullivan | C08G 77/58 428/195.1 |

* cited by examiner

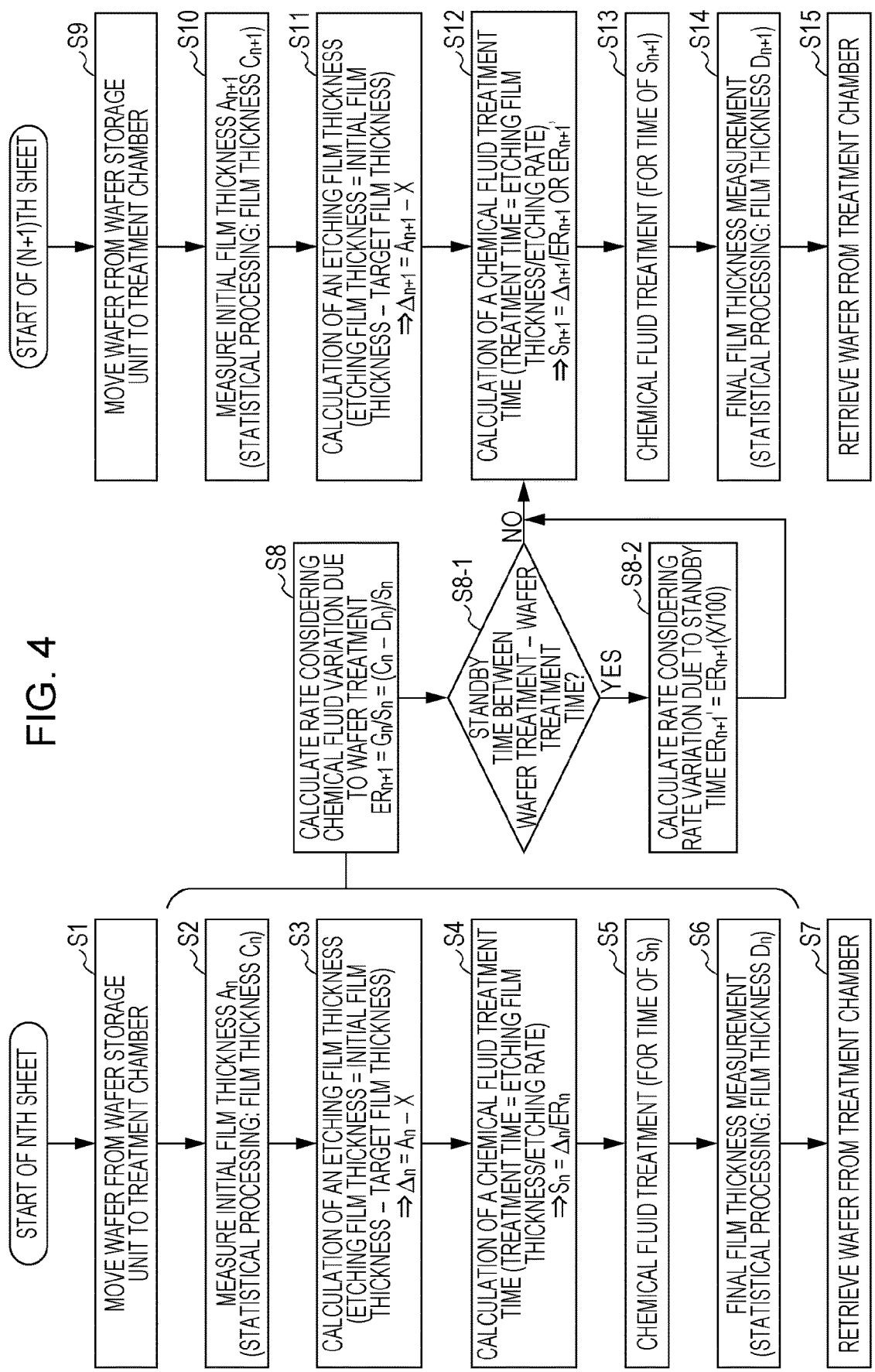

SEMICONDUCTOR MANUFACTURING APPARATUS

BACKGROUND

The present disclosure relates to a semiconductor manufacturing apparatus used for processing a film formed on a substrate to a desired film thickness and a method of manufacturing a semiconductor device. It also relates to a method of manufacturing an electronic device.

In the course of manufacturing a semiconductor device, there is a step of etching treatment of a film formed on top of a substrate to a predetermined thickness using wet etching. In the step of wet etching, in a case that an initial film thickness of a film subjected to etching treatment (hereinafter, a treated film) varies for each wafer, there has been a problem of occurring variations in final film thicknesses of treated films when etching treatment is carried out in same conditions to all wafers.

With that, in the past, semiconductor manufacturing apparatuses have been practically applied having a function that can suppress variations in film thicknesses of treated films after etching treatment even in a case that initial film thicknesses of the treated films vary. For example, in Japanese Unexamined Patent Application Publication No. 11-251288, as a semiconductor manufacturing apparatus capable of wet etching a treated film formed on top of a substrate to a predetermined film thickness, an apparatus for etching to a desired thickness while carrying out in-situ film measurement is proposed.

Thus, in a semiconductor manufacturing apparatus carrying out in-situ film measurement, that is, wet etching while carrying out film thickness measurement at the time of etching treatment, well controlled etching is enabled because the film thickness measurement is stabled as long as the substrate does not have wiring and the like pattern formed thereon. However, in a case of treating a substrate having a complex pattern, such as a device wafer, due to influence from the pattern during the film thickness measurement, stabled film thickness measurement is difficult to be carried out and the etching controllability turns out to be poor.

As another semiconductor manufacturing apparatus that wet etches a treated film formed on top of a substrate with good controllability, there is a semiconductor manufacturing apparatus carrying out treatment by calculating a treatment time corresponding to a variation in an initial film thickness of a treated film in advance. Thus, in a treatment method by calculating an etching treatment time in advance, a final film thickness of a treated film can be finished uniformly when using a chemical fluid having an invariant etching rate. However, in a case of using a chemical fluid having an etching rate changed over time due to consumption of a chemical fluid component at the time of etching treatment, volatilization and degradation of a chemical fluid component occurring at the time of process standby, and the like, it is difficult to finish a treated film stably in accordance with a preset value.

Accordingly, to terminate wet etching treatment with a film thickness of a treated film after etching in accordance with a preset film thickness even in a wafer having a complex pattern, the treatment time has to be modified for each wafer.

While the above description describes a case of wet etching a treated film, it is also similar in a step of polishing a treated film to a predetermined film thickness using a CMP technique.

In a case of a CMP apparatus, when there is a variation in an initial film thickness of a treated film for each wafer, a polishing treatment time has to be modified for each wafer to terminate the polishing in accordance with a preset film thickness. To calculate a polishing time for each wafer, it is desirable to accurately reflect a rate of polishing on the CMP apparatus. In the past, as shown in Japanese Unexamined Patent Application Publication No. 2004-319574 and Japanese Unexamined Patent Application Publication No. 11-186204, techniques of making an assumption on abrasion of a polishing pad and deterioration of a polishing slurry generated at the time polishing are proposed. However, since there is change over time due to alteration of a polishing pad or volatilization and degradation of a component of a slurry generated during a time of not carrying out polishing treatment, that is, during a process standby time, it is difficult to finish a treated film in accordance with a preset value.

SUMMARY

It is desirable to provide a semiconductor manufacturing apparatus capable of, regardless of a variation in an initial film thickness of a treated film formed on a substrate for each substrate, uniformly making a residual film of a treated film on each substrate. It is also desirable to provide a method of manufacturing a semiconductor device and a method of manufacturing an electronic device using the semiconductor manufacturing apparatus.

A semiconductor manufacturing apparatus according to an embodiment of the present disclosure is provided with a treatment chamber, a film thickness measurement unit, and a main body controlling unit. The treatment chamber treats a treated film of a wafer using a desired chemical fluid. The film thickness measurement unit measures an initial film thickness of the treated film before treatment and a final film thickness of the treated film after treatment. The main body controlling unit calculates a treatment speed of the chemical fluid from the initial film thickness, the final film thickness, and a chemical fluid treatment time taken from the initial film thickness to the final film thickness to calculate a chemical fluid treatment time for a wafer to be treated next from the calculated treatment speed.

According to a semiconductor manufacturing apparatus of an embodiment of the present disclosure, a chemical fluid treatment time for a wafer to be treated next is calculated from a treatment speed calculated from an initial film thickness, a final film thickness, and a chemical fluid treatment time of a wafer treated prior thereto. Therefore, even in a case of varying a treatment speed for deterioration of a chemical fluid component due to consumption of the chemical fluid, the variation in the treatment speed can be reflected on chemical fluid treatment of the next wafer every time. This enables chemical fluid treatment in accordance with a preset film thickness in all wafers even in a case that a film thickness of a treated film varies for each wafer.

Methods of manufacturing a semiconductor device and manufacturing an electronic device according to another embodiment of the present disclosure include placing a wafer having a treated film in a treatment chamber and measuring an initial film thickness of the treated film before treatment. They also include chemical fluid treating the wafer for a desired chemical fluid treatment time and measuring a final film thickness of the treated film after treatment. They also include calculating a treatment speed of a chemical fluid used for the chemical fluid treatment from the initial film thickness the final film thickness, and a chemical fluid treatment time taken from the initial film thickness to the final film thickness and calculating a chemical fluid treatment time for a wafer to be treated next from the calculated treatment speed.

In methods of manufacturing a semiconductor device and manufacturing an electronic device according to another embodiment of the present disclosure, an initial film thickness of a treated film before treatment and a final film thickness after treatment are measured to calculate a treatment speed of a chemical fluid from the initial film thickness, the final film thickness, and a chemical fluid treatment time. Then, a chemical fluid treatment time can be calculated by using the treatment speed of the chemical fluid as a treatment speed of a wafer to be treated next. This enables to make film thicknesses of treated films after chemical fluid treatment evenly in all wafers even in a case that the film thickness of a treated film varies for each wafer.

According to an embodiment of the present disclosure, regardless of a variation in an initial film thickness of a treated film formed on a substrate for each substrate, a residual film of a treated film on each substrate can be uniform.

BRIEF DESCRIPTION OF THE DRAWINGS

FIG. 4 is a flowchart showing a method of manufacturing a semiconductor device according to another embodiment of the present disclosure;

DETAILED DESCRIPTION OF EMBODIMENTS

In the course of manufacturing a semiconductor device when carrying out chemical fluid treatment of a treated film on a wafer, in a case that there is a variation for each wafer in an initial film thickness of a treated film as described above, a chemical fluid treatment time has to be modified for each wafer to terminate the chemical fluid treatment in accordance with a preset film thickness. Then, to calculate the chemical fluid treatment time for each wafer, it is desirable to accurately reflect a treatment speed (for example, an etching rate and a polishing rate) on a semiconductor manufacturing apparatus.

The present inventors have focused on that treatment efficiency of a chemical fluid turned out to be changed over time due to consumption, volatilization, degradation, and the like of a chemical fluid component to find a semiconductor manufacturing apparatus in which such change over time is reflected on a chemical fluid treatment time. That is, a semiconductor manufacturing apparatus of an embodiment of the present disclosure is configured to be provided with "a mechanism of reflecting change of a treatment speed with time due to consumption of a chemical fluid component" and "a mechanism of reflecting change of a treatment speed with time due to volatilization and degradation of a chemical fluid component during process standby".

A description is given below to an example of a semiconductor manufacturing apparatus according to an embodiment of the present disclosure and a method of manufacturing a semiconductor device and a method of manufacturing an electronic device using the semiconductor manufacturing apparatus with reference to FIGS. 1 through 6. Embodiments of the present disclosure are described in the following order. It should be noted that embodiments of the present disclosure are not limited to the examples below.

1. Embodiment: Example of Semiconductor Manufacturing Apparatus on Which Change of Treatment Speed with Time Due to Consumption of Chemical Fluid Component is Reflected
   1-1 Semiconductor Manufacturing Apparatus
   1-2 Method of Manufacturing Semiconductor Device
2. Another Embodiment: Example of Semiconductor Manufacturing Apparatus on Which Change of Treatment Speed with Time Due to Consumption of Chemical Fluid Component and Change of Treatment Speed with Time Due to Volatilization and Degradation of Chemical Fluid Component during Process Standby Are Reflected

1. Embodiment

[1-1 Semiconductor Manufacturing Apparatus]

Figure 1:
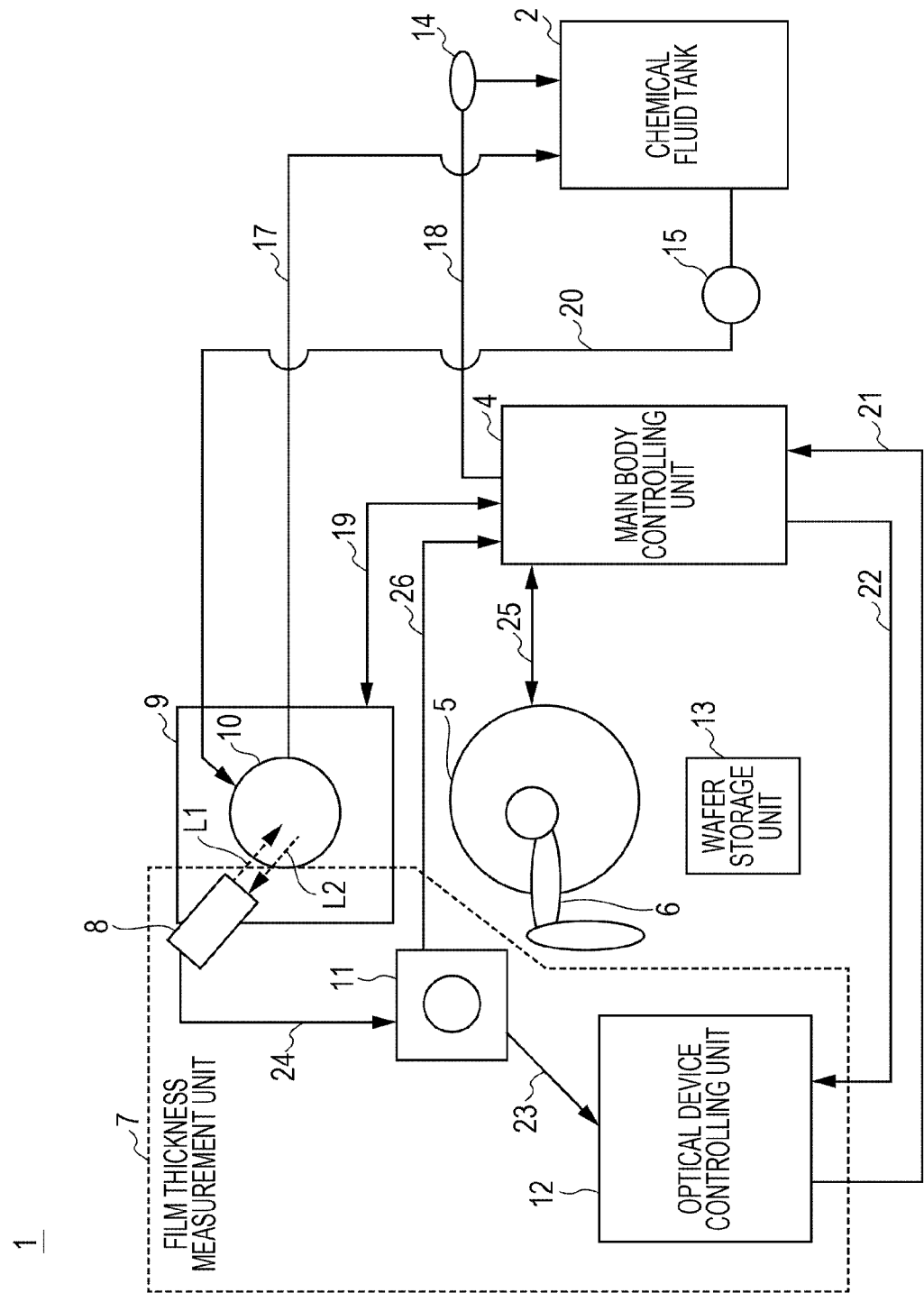
FIG. 1 is a diagrammatic configuration diagram of a semiconductor manufacturing apparatus according to an embodiment of the present disclosure.

FIG. 1 shows a configuration diagram of a semiconductor manufacturing apparatus 1 according to an embodiment of the present disclosure. In the embodiment, a description is given as the semiconductor manufacturing apparatus 1 to, for example, a wet etching apparatus that carries out etching treatment of a desired film of a semiconductor device using a chemical fluid. Therefore, a treatment speed of the semiconductor manufacturing apparatus 1 in the embodiment indicates an etching rate.

The semiconductor manufacturing apparatus 1 in the embodiment is provided with a treatment chamber 9, a chemical fluid tank 2, a main body controlling unit 4, a wafer delivery unit 5, a wafer storage unit 13, and a film thickness measurement unit 7.

The chemical fluid tank 2 has a chemical fluid, capable of wet etching a treated film formed on a wafer, therein retained in a state of being circulated and is connected to the treatment chamber 9 via chemical fluid pipes 20 and 17. The chemical fluid pipe 20 joining the chemical fluid tank 2 with the treatment chamber 9 is equipped with a supply pump 15, and the chemical fluid retained in the chemical fluid tank 2 is supplied into the treatment chamber 9 as desired by the supply pump 15. In a case of terminating etching treatment in the treatment chamber 9, the chemical fluid in the treatment chamber 9 is retrieved to the chemical fluid tank 2 through the chemical fluid pipe 17.

The treatment chamber 9 has a placement table 10, placing a wafer thereon delivered by the wafer delivery unit 5, therein. In the treatment chamber 9, the chemical fluid supplied from the chemical fluid tank 2 is discharged on the wafer to wet etch the treated film formed on top of the wafer.

The wafer delivery unit 5 is provided with a delivery arm 6 holding a wafer for delivery and delivers a wafer stored in the wafer storage unit 13 to the treatment chamber 9. In the wafer storage unit 13, untreated wafers and wafers after treatment are stored.

The film thickness measurement unit 7 is configured with a light source 11, a signal acquisition unit 8, and an optical device controlling unit 12. The light source 11 oscillates a light at a desired wavelength. The light source 11 is connected by the signal acquisition unit 8 and an optical fiber 24.

The signal acquisition unit 8 is configured to introduce the light oscillated in the light source 11 in a plane on which a treated film is formed in the wafer disposed in the treatment chamber 9 and also to acquire a reflection light L2 thereof.

The optical device controlling unit 12 is connected to the light source 11 by a communication cable 23 to control the light oscillated by the light source 11 and also to receive data of the reflection light L2 acquired in the signal acquisition unit 8 via the light source 11. The optical device controlling unit 12 has built-in analysis software, and by the analysis software, the film thickness of the treated film of the wafer is analyzed from the data of the irradiation light L1 irradiated from the signal acquisition unit 8 and the data of the reflection light L2 to the irradiation light L1.

The main body controlling unit 4 is connected to the optical device controlling unit 12, the light source 11, the treatment chamber 9, the wafer delivery unit 5, and a supply pump 14 respectively via communication cables 18, 19, 21, 22, 25, and 26. Then, the main body controlling unit 4 calculates an etching rate and a chemical fluid treatment time based on the data of the film thickness of the treated film sent from the optical device controlling unit 12 and the like, to control the optical device controlling unit 12, the light source 11, the treatment chamber 9, the wafer delivery unit 5, and the supply pump 14.

In the embodiment, for each treatment of one sheet of wafer, film thicknesses before and after treatment are measured by the film thickness measurement unit 7 to calculate the etching rate from the film thickness difference and the chemical fluid treatment time. By reflecting this etching rate on a chemical fluid treatment time for a wafer to be treated next, the change of the treatment speed (etching rate) with time due to consumption of the chemical fluid component at the time of wet etching treatment is reflected.

A description is given below to a method of manufacturing a semiconductor device using the semiconductor manufacturing apparatus 1 in the embodiment, which is a method of manufacturing a semiconductor device in which change of the etching rate with time due to consumption of the chemical fluid component is reflected on the chemical fluid treatment time.

[1-2 Method of Manufacturing Semiconductor Device]

A method of manufacturing a semiconductor device in the embodiment employs a measure of continuously updating data of an etching rate kept in the apparatus each after termination of chemical fluid treatment to reflect the change of the etching rate with time due to consumption of the chemical fluid component. That is, it is a method of measuring a film thickness of a treated film in the film thickness measurement unit 7 for each chemical fluid treatment of a wafer and obtaining an etching rate from the treatment film thickness and the time to reflect it on chemical fluid treatment of a next wafer. A specific configuration is described below.

Figure 2:
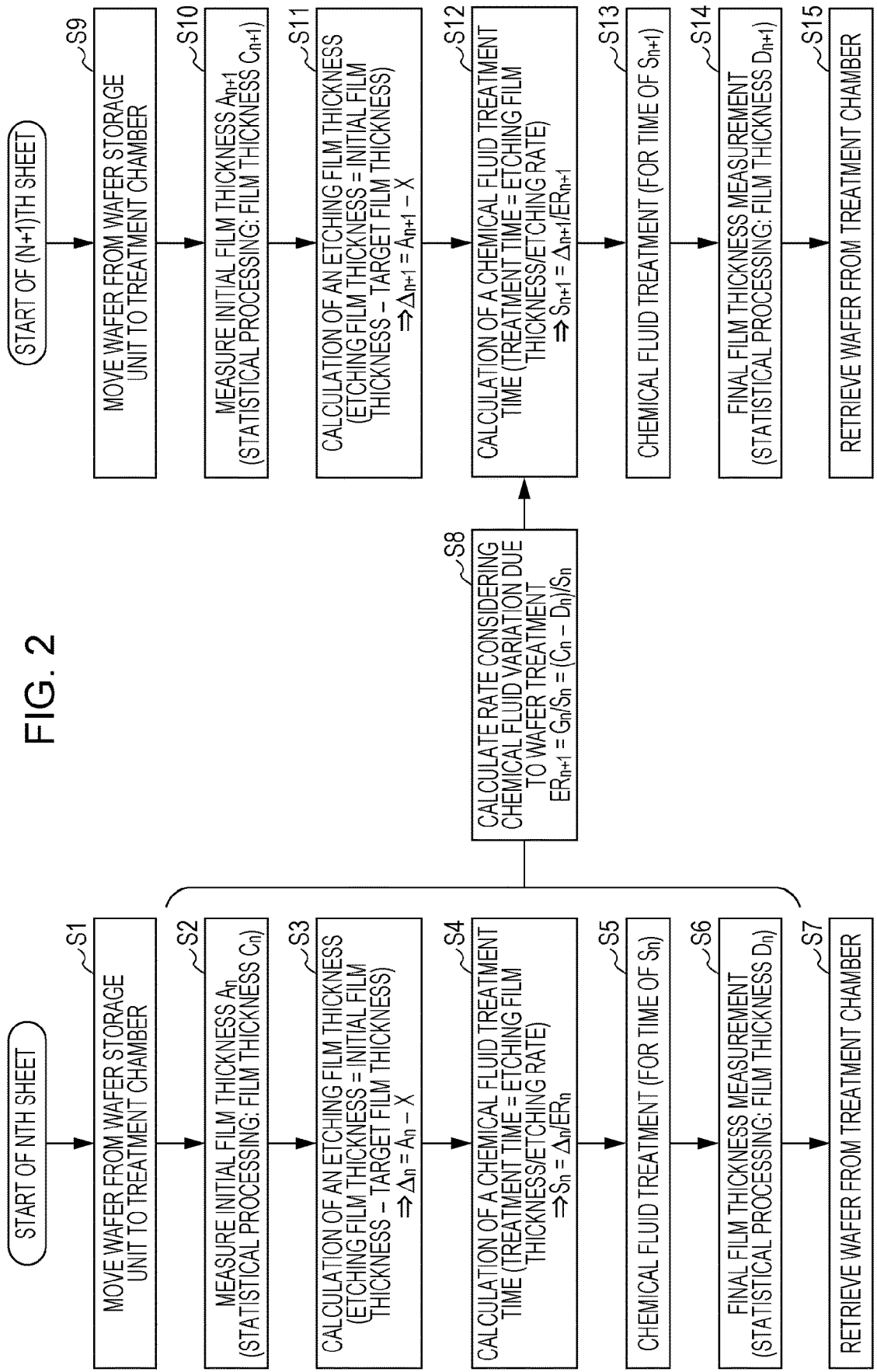
FIG. 2 is a flowchart showing a method of manufacturing a semiconductor device according to the embodiment of the present disclosure.

FIG. 2 is a flowchart showing steps of manufacturing a semiconductor device in the embodiment. It is a flowchart in a case of etching treatment of a plurality of wafers in order in the treatment chamber 9 using the same chemical fluid, and FIG. 2 is a flowchart when carrying out chemical fluid treatment of an Nth sheet of wafer and an (N+1)th sheet of wafer.

Firstly, a description is given to a case of wet etching an Nth sheet of wafer.

An Nth sheet of wafer is taken out of the wafer storage unit 13 by the delivery arm 6 of the wafer delivery unit 5 to place it on the placement table 10 in the treatment chamber 9 in such a manner that the treated film formed on the wafer becomes an upper surface (step S1).

After that, an initial film thickness $A_n$ of the treated film formed on the wafer is measured (step S2). The measurement of this initial film thickness $A_n$ may be measured using the film thickness measurement unit 7 equipped in the semiconductor manufacturing apparatus 1 and may also be measured in advance with another film thickness measuring instrument. In a case of measuring a film thickness using the film thickness measurement unit 7 equipped in the semiconductor manufacturing apparatus 1, the irradiation light L1 at a desired wavelength from the signal acquisition unit 8 is irradiated to the treated film to measure an interference spectrum of the reflection light L2, thereby enabling to obtain the film thickness. This principle of film thickness measurement is similar to a principle of general film thickness measurement using an optical system.

At this time, a statistical value (hereinafter, a statistical initial film thickness $C_n$) of the initial film thickness $A_n$ for calculation of an etching rate $ER_{n+1}$ of an (N+1)th sheet described later is also measured. A method of calculating the statistical initial film thickness $C_n$ is described later. Data of the initial film thickness $A_n$ is sent to the main body controlling unit 4 to calculate the desired etching film thickness amount $\Delta_n$ in the optical device controlling unit 12 using an expression below on the basis of information of a target film thickness X preset in a process recipe in the main body controlling unit 4 (step S3).

$$\Delta_n = A_n - X \tag{1}$$

Next, using the etching film thickness amount $\Delta_n$ obtained in (1) and the etching rate $ER_n$, a chemical fluid treatment time $S_n$ for the Nth sheet of wafer is calculated using an expression below (step S4).

$$S_n = \Delta_n / ER_n \tag{2}$$

This etching rate $ER_n$ is an etching rate calculated at the time of etching treatment of an (N−1)th sheet of wafer. Details of this method of calculating an etching rate are described later. Regarding N=1, that is, a wafer to be treated firstly after exchanging a chemical fluid, a chemical fluid treatment time $S_1$ is calculated using an etching rate $ER_1$ (fixed value) determined by a chemical fluid mixing ratio.

Then, using the chemical fluid treatment time $S_n$ obtained using (2), chemical fluid treatment is carried out (step S5). After that, using the film thickness measurement unit 7, to calculate an etching rate $ER_{n+1}$ applied to chemical fluid treatment of the (N+1)th sheet of wafer, a statistical value (hereinafter, a statistical final film thickness $D_n$) of the final film thickness is measured (step S6). Then, the Nth sheet of wafer that have terminated the chemical fluid treatment, that is, wet etching is retrieved from inside the treatment chamber 9 using the delivery arm 6 to store it in the wafer storage unit 13 (step S7).

Then, from the statistical initial film thickness $C_n$ and the statistical final film thickness $D_n$ obtained at the time of the chemical fluid treatment of the Nth sheet of wafer, an etching rate $ER_{n+1}$ is obtained considering a variation in the chemical fluid component due to wafer treatment using an expression below (step S8).

$$ER_{n+1} = G_n / S_n = (C_n - D_n) / S_n \tag{3}$$

This etching rate $ER_{n+1}$ is a value in which a variation in the chemical fluid component due to the wafer treatment of the Nth sheet is considered and becomes a value to be used as an etching rate of the (N+1)th sheet of wafer. That is, the etching rate $ER_n$ used at the time of etching the Nth sheet of wafer is updated to the newly calculated etching rate $ER_{n+1}$.

The etching rate $ER_n$ used at the time of the etching treatment of the Nth sheet of wafer is also a value obtained similarly at the time of etching treatment of the (N−1)th sheet of wafer.

The film thickness measurement unit 7 for measurement of the initial film thickness and the final film thickness is in the treatment chamber 9 or in a space dedicated for measurement in the semiconductor manufacturing apparatus 1. A method of obtaining the initial film thickness and the final film thickness may be classified roughly into two.

Figure 3A:
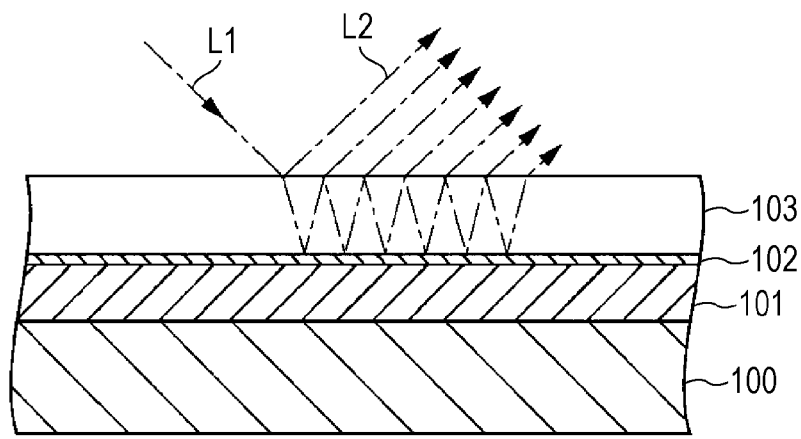
FIGS. 3A and 3B are cross-sectional views of a semiconductor device in a case that there is no pattern on a wafer and a case that there is a pattern.

Firstly, a first method is a method of measuring a film thickness of a treated film at any coordinates on a wafer with the film thickness measurement unit 7 without adding a pattern recognition mechanism for the semiconductor manufacturing apparatus 1 to recognize a wafer pattern in order to increase the throughput of the semiconductor manufacturing apparatus 1. In a case of using this method, a difference occurs in the obtained film thicknesses between wafers with and without a device pattern. FIG. 3A illustrates a cross-sectional configuration of a semiconductor device without a device pattern, and FIG. 3B illustrates a cross-sectional configuration of a semiconductor device with a device pattern.

Figure 3B:
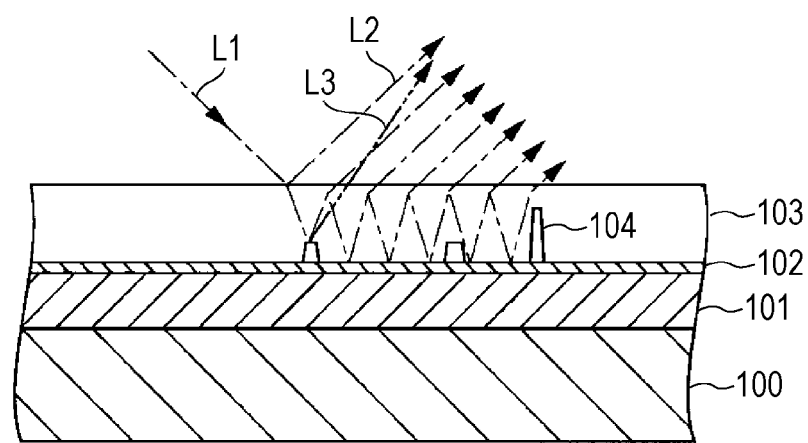

In FIGS. 3A and 3B, a first lamination film 101 and a second lamination film 102 are formed on a substrate (wafer) 100, and in a semiconductor device in FIG. 3B, a device pattern 104 is formed on the second lamination film 102. In the film thickness measurement unit 7, as shown in FIGS. 3A and 3B, a light is irradiated to a treated film 103 formed on the second lamination film 102 to obtain an interference spectrum of the reflection light L2 being reflected on the second lamination film 102 and outgoing from a surface of the treated film 103, thereby measuring the film thickness of the treated film 103.

As in FIG. 3A, in a wafer without a device pattern or a wafer with a pattern for film thickness measurement prepared in advance, since there is no concavity and convexity in an interface of the treated film 103 in the measurement region, the reflection light L2 returns stably. Therefore, stable measurement of the film thickness of the treated film 103 is enabled. However, in actual device manufacture, as shown in FIG. 3B, a wafer has a device pattern thereon. Thus, in a semiconductor device with the device pattern 104 formed therein and without a pattern for film thickness measurement prepared in advance, an interface of a treated film in a measurement region has concavity and convexity, and in the area of concavity and convexity, a reflection light having a reflection angle different from the angle of the reflection light L2 appears as shown with a reflection light L3. Thus, in a wafer having the device pattern 104, reflection lights return in a state of having information of each interface mixed therein, so that it becomes extremely difficult to obtain information of a true film thickness value.

With that, in a case of measuring a film thickness of the treated film at any coordinates on the wafer with the film thickness measurement unit 7, multipoint measurement that measures a plurality of spots on the wafer is carried out to increase the accuracy to the measurement result for statistical processing of a plurality of numerical data items. As the multipoint measurement, for example, there is a method of measuring while driving the signal acquisition unit 8 on the wafer or a method of measuring while fixing the signal acquisition unit 8 and rotating the wafer. In a case of driving the signal acquisition unit 8, a measurement distance interval can be set arbitrarily, and in a case of measuring by fixing the signal acquisition unit 8 at a fixed position, the fixed position of the signal acquisition unit 8 and the number of rotation of the wafer can be set arbitrarily. A number of measurements can be set arbitrarily, and it is preferred to measure measurement points sufficient for convergence of the statistical values of the film thickness values.

A method of statistically processing the plurality of numerical data items obtained by the multipoint measurement can be set arbitrarily from a normal statistical processing method. For example, it includes a normal averaging process, median, an average value of measurements except outside 2σ, and the like. Then, the results (the statistical initial film thickness $C_n$ and the statistical final film thickness $D_n$) of statistical processing thus obtained are sent to the main body controlling unit 4 of the semiconductor manufacturing apparatus 1.

A second method of obtaining a film thickness of the treated film is a method of carrying out film thickness measurement by giving a pattern recognition mechanism in the semiconductor manufacturing apparatus 1 while avoiding the device pattern. In this case, it is enabled to carry out measurement at precisely specified measurement positions. However, in order to measure a precisely specified region, it is desirable to divide the wafer treatment chamber 9 from a measurement chamber having the pattern recognition mechanism or to equip a space for enabling precise movement of the signal acquisition unit 8 in the treatment chamber 9. In this method, although the throughput of the semiconductor manufacturing apparatus 1 decreases, the film thickness of the treated film can be measured not as a statistical value but as a true film thickness value, so that accurate measurement is enabled. In a case of using a semiconductor device provided with a pattern recognition mechanism, it is possible to select a method of measuring only one spot or a method of carrying out multipoint measurement. In a case of carrying out multipoint measurement, performing statistical processing similar to the above description enables film thickness measurement of high accuracy.

In the method of manufacturing a semiconductor device in the embodiment, the statistical initial film thickness $C_n$ and the statistical final film thickness $D_n$ are configured to be obtained by multipoint measurement.

Next, a description is given to a case of wet etching an (N+1)th sheet of wafer.

Firstly, an (N+1)th sheet of wafer is taken out of the wafer storage unit 13 by the delivery arm 6 of the wafer delivery unit 5 to place it on the placement table 10 in the treatment chamber 9 in such a manner that the treated film formed on the wafer becomes an upper surface (step S9). After that, similar to the Nth sheet of wafer, an initial film thickness $A_{n+1}$ of the treated film formed on the wafer is measured. At this time, a statistical value (hereinafter, a statistical initial film thickness $C_{n+1}$) of the initial film thickness $A_{n+1}$ for calculation of an etching rate $ER_{n+2}$ of an (N+2)th sheet described later is also measured. A method of calculating the statistical initial film thickness $C_{n+1}$ is similar to the method of calculating a statistical initial film thickness $C_n$. Data of the initial film thickness $A_{n+1}$ is sent to the main body controlling unit 4 to calculate the desired etching film thickness amount $\Delta_{n+1}$ in the optical device controlling unit 12 using an expression below on the basis of information of a target film thickness X preset in a process recipe in the main body controlling unit 4 (step S11).

$$\Delta_{n+1} = \Delta_{n+1} - X \quad (4)$$

Next, using the etching film thickness amount $\Delta_{n+1}$ obtained in (4) and the etching rate $ER_{n+1}$ in the Nth sheet of wafer obtained in step S8, a chemical fluid treatment time $S_{n+1}$ for the (N+1)th sheet of wafer is calculated using an expression below (step S12).

$$S_{n+1} = A_{n+1}/ER_{n+1} \quad (5)$$

Then, using the chemical fluid treatment time $S_{n+1}$ obtained using (4), chemical fluid treatment is carried out (step S13). After that, using the film thickness measurement unit 7, to calculate an etching rate $ER_{n+2}$ applied to chemical fluid treatment of the (N+2)th sheet of wafer, a statistical value (hereinafter, a statistical final film thickness $D_{n+1}$) of the final film thickness is measured (step S14). Then, the (N+1)th sheet of wafer that have terminated the chemical fluid treatment, that is, wet etching is retrieved from inside the treatment chamber 9 using the delivery arm 6.

After that, similar to step S8, from the statistical initial film thickness $C_{n+1}$ and the statistical final film thickness $D_{n+1}$ obtained at the time of the chemical fluid treatment of the (N+1)th sheet of wafer, an etching rate $ER_{n+2}$ is obtained considering a variation in the chemical fluid component due to wafer treatment using an expression below.

$$ER_{n+2} = G_{n+1}/S_{n+1} = (C_{n+1} - D_{n+1})/S_{n+1} \quad (6)$$

This etching rate $ER_{n+2}$ is a value in which a variation in the chemical fluid component due to the wafer treatment of the (N+1)th sheet is considered and this etching rate $ER_{n+2}$ is used as an etching rate of the (N+2)th sheet of wafer.

Then, also in a case of etching treatment of an (N+2)th, (N+3)th, or . . . of wafer, an etching rate is calculated for each wafer by repeating the steps described above to enable to calculate a chemical fluid treatment time for a wafer to be treated next from the etching rate. This reflects a change of a chemical fluid component with time on a chemical fluid treatment time for each wafer and enables to reduce a variation in a film thickness of a treated film of each wafer.

The calculation of the expressions (1) through (6) is made mainly in the main body controlling unit 4, and the main body controlling unit 4 controls each unit by the calculated etching rate. While the embodiment is configured to carry out the calculation of expressions (1) through (6) in the main body controlling unit 4, the statistical processing of the film thickness measurement and the like may also be controlled by an optical device controlling unit. A variety of modifications are possible in which control unit to carry out what kind of operation.

As described above, in the embodiment, even in a case of treating a plurality of wafer sheets without exchanging a chemical fluid, an etching rate is updated for each time of chemical fluid treatment to determine the chemical fluid treatment time on the basis of the etching rate. This enables to make a residual film of a treated film of each wafer uniform even in a case that a chemical fluid component is consumed and turns out to be changed over time by continuously treating a plurality of wafer sheets using the same chemical fluid.

In the embodiment, even when an initial film thickness of a treated film of each wafer varies, a chemical fluid treatment time can be calculated from the initial film thickness and the etching rate in immediately previous etching treatment. Therefore, regardless of the variation in the initial film thickness, accurate etching treatment can be carried out in each wafer.

2. Another Embodiment

Next, a description is given to a semiconductor manufacturing apparatus according to another embodiment of the present disclosure and a method of manufacturing a semiconductor device using the semiconductor manufacturing apparatus. A semiconductor manufacturing apparatus in the other embodiment is a semiconductor manufacturing apparatus on which change with time of treatment performance due to consumption of a chemical fluid component and a throughput due to volatilization and degradation of a chemical fluid component during process standby is reflected. That is, this is an example of further reflecting change of treatment performance with time due to volatilization and degradation of a chemical fluid component during process standby in the semiconductor manufacturing apparatus according to the previous embodiment.

Since the semiconductor manufacturing apparatus in the embodiment is different only in a method of calculating an etching rate calculated in the main body controlling unit 4 from the semiconductor manufacturing apparatus 1 according to the previous embodiment and the overall configuration is similar to FIG. 1, a description is given also using FIG. 1 in the embodiment. FIG. 4 is a flowchart showing steps of manufacturing a semiconductor substrate in the embodiment. In FIG. 4, identical reference characters are assigned to the parts corresponding to FIG. 2 to omit repetitive descriptions.

In the embodiment, in a case that there is a standby time between an Nth sheet of wafer and an (N+1)th sheet of wafer in the etching rate calculated for each wafer treatment, a variation in a state of the chemical fluid during the standby time is added to the etching rate.

Figure 5:
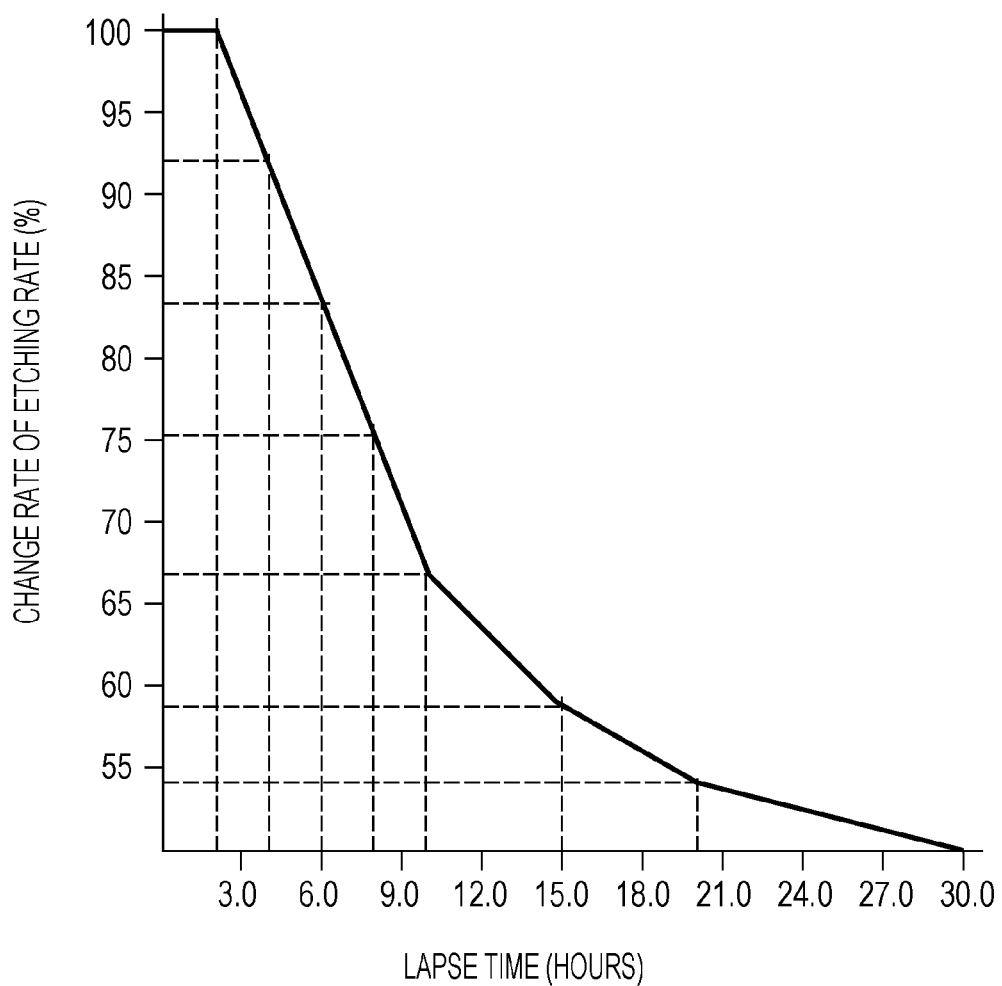
FIG. 5 illustrates a variation rate of an etching rate of a chemical fluid used for a method of manufacturing a semiconductor device according to the other embodiment of the present disclosure to time.

FIG. 5 illustrates a variation rate of a chemical fluid used for a method of manufacturing a semiconductor device in the embodiment to a time of an etching rate. In FIG. 5, the horizontal axis denotes a time and the vertical axis denotes a change rate of an etching rate. As shown in FIG. 5, a chemical fluid used for chemical fluid treatment turns out to have an etching rate varying with time due to volatilization, degradation, and the like of the chemical fluid itself.

Figure 6:
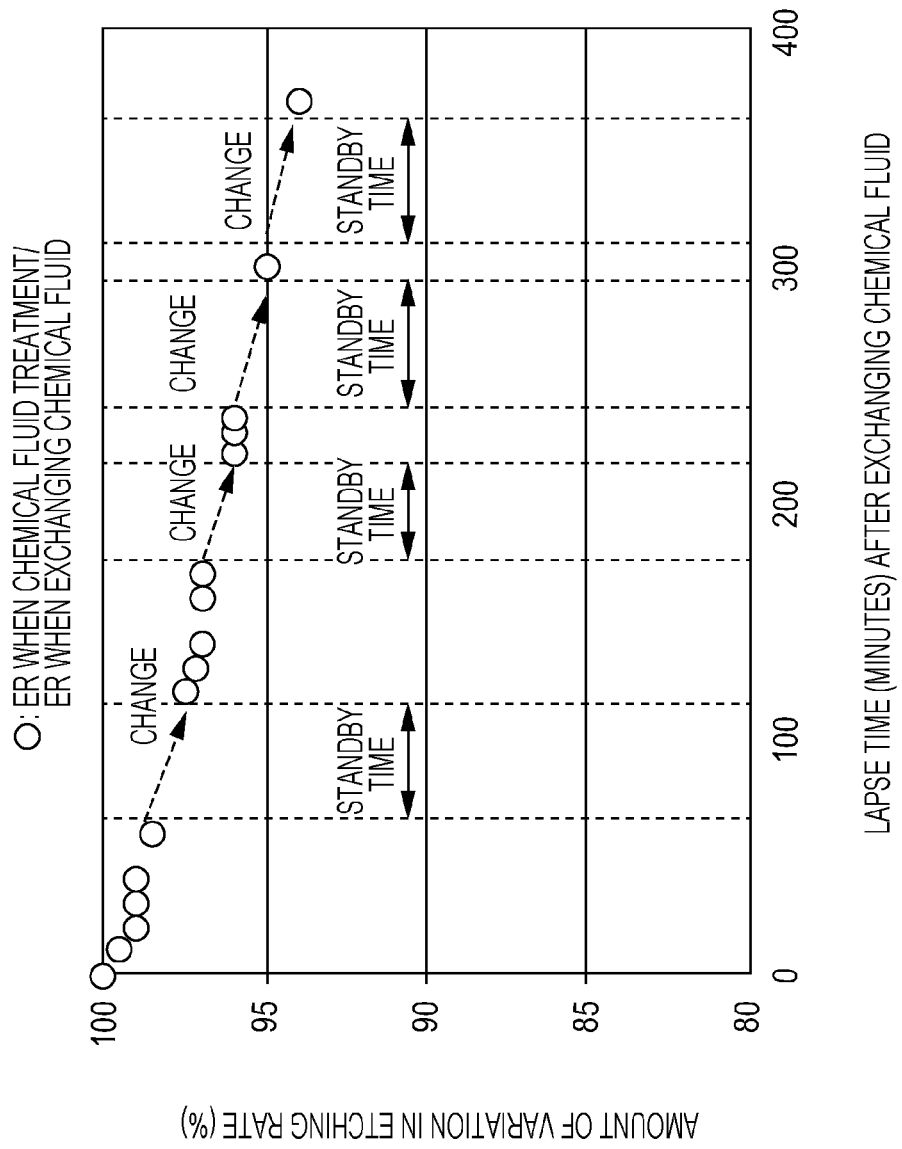
FIG. 6 illustrates a variation rate of an etching rate in a case that there is a standby time between a wafer to be treated and a wafer to be treated next.

FIG. 6 illustrates a variation rate of an etching rate in a case that there is a standby time between a wafer to be treated and a wafer to be treated next. In FIG. 6, the horizontal axis denotes a lapse time after exchanging a chemical fluid and the vertical axis denotes an amount of variation in an etching rate. The amount of variation in an etching rate shown in FIG. 6 is obtained by a ratio of an etching rate at the time of chemical fluid treatment to an etching rate at the time of exchanging a chemical fluid (that is, an etching rate of a chemical fluid to be a standard).

As shown in FIG. 5, from a property of naturally changing an etching rate due to a lapse time, even in a case of not consuming a chemical fluid component by etching treatment as shown in FIG. 6, in a case that there is a standby time between wafers to be treated, the etching rate varies naturally. The variation in an etching rate to a standby time influences a chemical fluid treatment time and so it is difficult to ignore a case of a long standby time.

In the semiconductor manufacturing apparatus 1 in the embodiment, data of such a variation curve in an etching rate to a standby time is memorized in the main body controlling unit 4 in advance, and in a case that there is a standby time, a program reflects a variation in the etching rate corresponding to the standby time.

To reflect a variation in an etching rate corresponding to the standby time, after the step of calculating the etching rate $ER_{n+1}$ considering a chemical fluid variation due to wafer treatment (step S8), determination of whether or not there is a standby time between an Nth sheet of wafer and an (N+1)th sheet of wafer is carried out (step S8-1). In a case of determining there is no standby time, similar to the previous embodiment, the procedure goes on to treatment of the (N+1)th sheet of wafer.

In contrast, in a case of determining as there is a standby time in step S8-1, an etching rate $ER_{n+1}'$ (treatment speed after correction) considering a variation in an etching rate due to the standby time is calculated by an expression below (step S8-2).

$$ER_{n+1}'=ER_{n+1}(X/100) \quad (7)$$

Here, X in the expression (7) is the variation rate (%) of an etching rate corresponding to the standby time obtained in FIG. 5. Then, in a case that there is a standby time, this makes an etching rate $ER_{n+1}'$ to be obtained on which a variation rate of an etching rate corresponding to a standby time is reflected, and this etching rate is used for calculation of a chemical fluid treatment time for the (N+1)th sheet of wafer. Accordingly, in a case of determining that there is a standby time, the chemical fluid treatment time for an (N+1)th sheet is calculated in step S12 by an expression below.

$$S_{n+1}=A_{n+1}/ER_{n+1}' \quad (8)$$

The standby time may be a time between a wafer to be treated and a wafer to be treated next and may also be a time between lots in a case of treating per lot. A standby time per lot is a time from treatment of the last wafer in a Pth lot to treatment of the first wafer in the next (P+1)th lot.

The determination of whether or not there is a standby time, that is, what extent of time lapse to be determined that there "is" a standby time or "is not" in step S8-1 can be determined depending on accuracy of the semiconductor manufacturing apparatus. The variation curve of a chemical fluid shown in FIG. 5 can use same data only in a case that a variety of parameters related to the chemical fluid tank 2, such as chemical fluid composition and a chemical fluid temperature, are constant. In a case that conditions of the chemical fluid are changed, data of the variation curve of the chemical fluid may be newly input to the main body controlling unit 4 to configure a program to obtain the etching rate $ER_{n+1}'$ in step S8-2.

In the semiconductor manufacturing apparatus in the embodiment, a chemical fluid variation during process standby can be reflected on the etching rate, so that etching of higher accuracy is enabled. In addition, since a chemical fluid variation in a standby state can be reflected on the etching treatment time, a frequency of exchanging a chemical fluid having been carried out to avoid change of the chemical fluid with time can be reduced and the manufacturing costs can be reduced. Furthermore, it also has effects similar to those of the previous embodiment.

Although examples of sheet-type etching treatment apparatuses carrying out etching treatment per sheet are described in the embodiments described above, the examples may also be batch-type etching treatment apparatuses treating a plurality of wafer sheets in one time. In a case of a batch-type etching treatment apparatus, one representative sheet is selected and the initial film thickness and the final film thickness are measured to calculate an etching rate of the turn. Then, using the etching rate, a chemical fluid treatment time for etching treatment of the next turn is calculated.

In the semiconductor manufacturing apparatus according to the above embodiments, it is possible to carry out, for example, chemical fluid treatment using hydrofluoric nitric acid to form a through electrode or to form a polysilicon layer on top of the wafer and chemical fluid treatment using hot hydrofluoric acid to etch an SiN film.

Although the above embodiments are described with examples of using etching treatment apparatuses as a semiconductor manufacturing apparatus, they can be applied to a variety of apparatuses, such as a CMP apparatus, that process a treated film formed on a wafer utilizing a chemical fluid. In a case of applying a semiconductor manufacturing apparatus of an embodiment of the present disclosure to a CMP apparatus, a program may be configured to calculate a polishing rate on which change of a slurry component with time is reflected for each wafer and then to calculate a polishing treatment time for a wafer to be polished next from there.

CMP apparatuses in the past do not have a technique of reflecting alteration of a pad generated during a time of not carrying out a process, that is, a standby time and change over time in which a slurry component volatiles or changes. Therefore, in a process carried out after generation of a standby time, treatment such as treating a dummy wafer or reflecting a result of polishing a first sheet of wafer on the next wafer becomes desired. In this case, there have been problems of costs of the dummy wafer and generation of a variation in finish of a first sheet of wafer at the time of beginning a process.

In an embodiment of the present disclosure, it is possible in a CMP apparatus to keep a time curve of a polishing speed occurring for chemical change of a slurry and alteration of a pad in the apparatus to calculate a polishing time for each wafer using the time curve. This enables to accurately set a polishing time and to make processing accuracy stable.

A semiconductor device possible to be manufactured by an embodiment of the present disclosure may include, for example, a solid-state imaging apparatus provided with a plurality of pixels and a circuit board having a logic circuit. By forming a solid-state imaging apparatus using a method of manufacturing a semiconductor device of an embodiment of the present disclosure, the yield ratio is improved. In addition, by configuring an electronic device, such as a camera, using the solid-state imaging apparatus or the circuit board, accuracy is improved.

Embodiments of the present disclosure are not limited to the embodiments described above and a variety of modifications and combinations are possible without departing from the spirit.

The present disclosure contains subject matter related to that disclosed in Japanese Priority Patent Application JP 2011-054702 filed in the Japan Patent Office on Mar. 11, 2011, the entire contents of which are hereby incorporated by reference.

What is claimed is:

1. A semiconductor manufacturing apparatus, comprising:
   a treatment chamber for treatment of a treated film of a first wafer with a chemical fluid; and
   a circuit board configured to:
      measure a plurality of initial film thickness values of the treated film in a plurality of spots on a top surface of the first wafer;
      calculate an initial film thickness based on an average value of the measured plurality of initial film thickness values;
      measure a plurality of final film thickness values of the treated film in the plurality of spots on the top surface of the first wafer;
      calculate a final film thickness based on an average value of the measured plurality of final film thickness values;

calculate a first treatment speed of the chemical fluid based on the initial film thickness, the final film thickness, and a first chemical fluid treatment time taken to change a film thickness from the initial film thickness to the final film thickness;

determine a standby time period that is a first time period between a first chemical fluid treatment of the first wafer and a second chemical fluid treatment of a second wafer;

determine a change in an etching rate of the chemical fluid based on the standby time period;

calculate a second treatment speed of the chemical fluid by correction of the first treatment speed based on the change in the etching rate of the chemical fluid and the determination of the standby time period; and calculate a second chemical fluid treatment time for the second wafer to be treated, based on the calculated second treatment speed.

2. The semiconductor manufacturing apparatus according to claim 1, wherein the circuit board is further configured to hold data of a variation curve that shows a variation rate of the calculated second treatment speed of the chemical fluid with lapse of time.

3. The semiconductor manufacturing apparatus according to claim 1, wherein the standby time period further corresponds to a second time period between a third chemical fluid treatment of a Pth lot, where P is a natural number, and a fourth chemical fluid treatment of a (P+1)th lot, and the change in the etching rate of the chemical fluid, due to volatilization of the chemical fluid, after the treatment of the first wafer and before the treatment of the second wafer is based on the standby time period.

4. A semiconductor manufacturing apparatus, comprising:

a treatment chamber for treatment of a treated film of a first wafer based on a wet etch process with a chemical fluid;

a circuit board configured to:

measure a plurality of initial film thickness values of the treated film in a plurality of spots on a top surface of the first wafer;

calculate an initial film thickness based on an average value of the measured plurality of initial film thickness values;

measure a plurality of final film thickness values of the treated film in the plurality of spots on the top surface of the first wafer;

calculate a final film thickness based on an average value of the measured plurality of final film thickness values;

calculate a first treatment speed of the chemical fluid based on the initial film thickness and the final film thickness;

determine a standby time period that is a first time period between a first chemical fluid treatment of the first wafer and a second chemical fluid treatment of a second wafer;

determine a change in an etching rate of the chemical fluid based on the standby time period;

calculate a second treatment speed of the chemical fluid by correction of the first treatment speed based on the change in the etching rate of the chemical fluid and the determination of the standby time period; and calculate a chemical fluid treatment time for the second wafer to be treated, based on the calculated second treatment speed.

5. A semiconductor manufacturing apparatus, comprising:

a treatment chamber for treatment of a treated film of a first wafer with a chemical fluid;

a circuit board configured to:

measure a plurality of initial film thickness values of the treated film in a plurality of spots on a top surface of the first wafer based on a device pattern on the first wafer;

calculate an initial film thickness based on an average value of the measured plurality of initial film thickness values;

measure a plurality of final film thickness values of the treated film in the plurality of spots on the top surface of the first wafer based on the device pattern on the first wafer;

calculate a final film thickness based on an average value of the measured plurality of final film thickness values;

calculate a first treatment speed of the chemical fluid from the initial film thickness, the final film thickness, and a first chemical fluid treatment time taken from the initial film thickness to the final film thickness;

determine a standby time period that is a first time period between a first chemical fluid treatment of the first wafer and a second chemical fluid treatment of a second wafer;

determine a change in an etching rate of the chemical fluid based on the standby time period;

calculate a second treatment speed of the chemical fluid by correction of the first treatment speed based on the change in the etching rate of the chemical fluid and the determination of the standby time period; and calculate a second chemical fluid treatment time for the second wafer to be treated, based on the calculated second treatment speed.

6. The semiconductor manufacturing apparatus according to claim 5, wherein the circuit board is further configured to measure the plurality of initial film thickness values and the plurality of final film thickness values based on the device pattern on the first wafer.

7. The semiconductor manufacturing apparatus according to claim 6, wherein the circuit board is further configured to determine formation of the device pattern on the first wafer, based on a measurement of a first reflection angle of light reflected from a surface of the treated film and a comparison of the measured first reflection angle with a second reflection angle of the reflected light affected by at least one of a concavity on the surface of the treated film or a convexity on the surface of the treated film.

8. The semiconductor manufacturing apparatus according to claim 5, wherein the circuit board is further configured to determine formation of the device pattern on the first wafer based on a statistical process on a plurality of numerical data items, and at least one of the plurality of initial film thickness values of the treated film before the treatment or the plurality of final film thickness values of the treated film after the treatment comprises the plurality of numerical data items.

9. The semiconductor manufacturing apparatus according to claim 8, wherein the circuit board is further configured to determine formation of the device pattern on the first wafer, based on a measurement of a first reflection angle of light reflected from a surface of the treated film and a comparison of the measured first reflection angle with a second reflection angle of the reflected light affected by at least one of a concavity on the surface of the treated film or a convexity on the surface of the treated film.

10. The semiconductor manufacturing apparatus according to claim 5, wherein the circuit board is further configured to determine formation of the device pattern on the first wafer, based on a measurement of a first reflection angle of light reflected from a surface of the treated film and a comparison of the measured first reflection angle with a second reflection angle of the reflected light affected by at least one of a concavity on the surface of the treated film or a convexity on the surface of the treated film.

* * * * *